(12) United States Patent
Ravi

(10) Patent No.: US 7,098,047 B2
(45) Date of Patent: Aug. 29, 2006

(54) WAFER REUSE TECHNIQUES

(75) Inventor: Kramadhati V. Ravi, Atherton, CA (US)

(73) Assignee: Intel Corporation, Santa Clara, CA (US)

( * ) Notice: Subject to any disclaimer, the term of this patent is extended or adjusted under 35 U.S.C. 154(b) by 149 days.

(21) Appl. No.: 10/718,102

(22) Filed: Nov. 19, 2003

(65) Prior Publication Data
US 2005/0106881 A1    May 19, 2005

(51) Int. Cl.
*H01L 21/00*    (2006.01)

(52) U.S. Cl. .......................... 438/12; 438/14
(58) Field of Classification Search ............ 438/14–18, 438/7–12; 700/110, 121; 702/82–83
See application file for complete search history.

(56) References Cited

U.S. PATENT DOCUMENTS

| 4,526,468 A | * | 7/1985 | Steigmeier et al. | ......... 356/338 |
| 6,406,981 B1 | | 6/2002 | Ravi | |
| 6,761,625 B1 | * | 7/2004 | Rojhantalab et al. | ....... 451/288 |

* cited by examiner

*Primary Examiner*—Thanhha Pham
(74) *Attorney, Agent, or Firm*—Glen B. Choi

(57) ABSTRACT

Briefly, test wafer reuse techniques.

13 Claims, 3 Drawing Sheets

WAFER REUSE TECHNIQUES

FIELD

The subject matter disclosed herein generally relates to silicon wafer reuse techniques.

DESCRIPTION OF RELATED ART

Test and monitor silicon wafers are typically used in larger numbers in both new process development and manufacturing testing procedures. For example, FIG. 1 depicts a prior art process in which a single crystal silicon wafer is used to test new process development and manufacturing testing procedures in semiconductor tools. After testing the tool, the wafer is chemically etched to remove any surface contaminants. Next, the wafer can be surface polished. Thereafter, the wafer may be reused to qualify the same or a different semiconductor tool. Polishing the wafer results in the progressive thinning of the wafer, due to material removal, thus limiting the number of times the wafer can be reused. Currently test wafers are reused only once. Further, because of possible metal contamination concerns, reused wafers are typically limited to use for limited purposes (e.g., back end processes) and so have a limited range of capabilities to test new process development and test procedures in semiconductor tools. These test and monitor wafers represent a large cost item and do not generate revenue. It is desirable to test semiconductor tools in as low a cost manner as possible.

BRIEF DESCRIPTION OF THE DRAWINGS

Note that use of the same reference numbers in different figures indicates the same or like elements.

DETAILED DESCRIPTION

Figure 1:
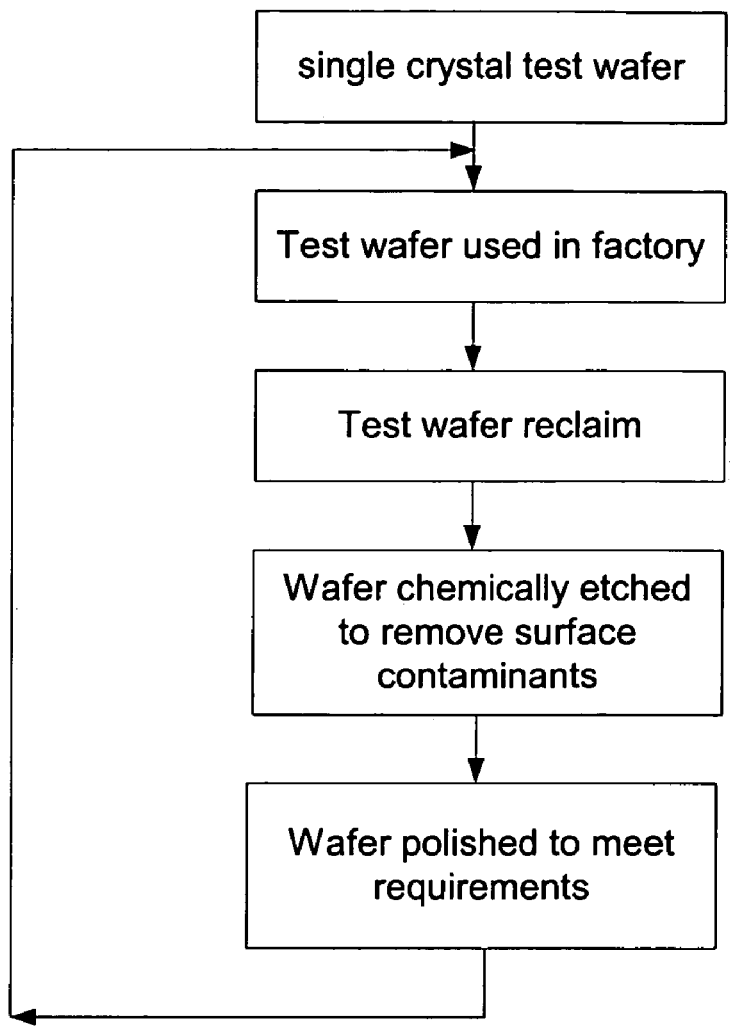
FIG. 1 depicts a prior art process in which a single crystal silicon wafer is used to test a semiconductor tool.
Figure 2:
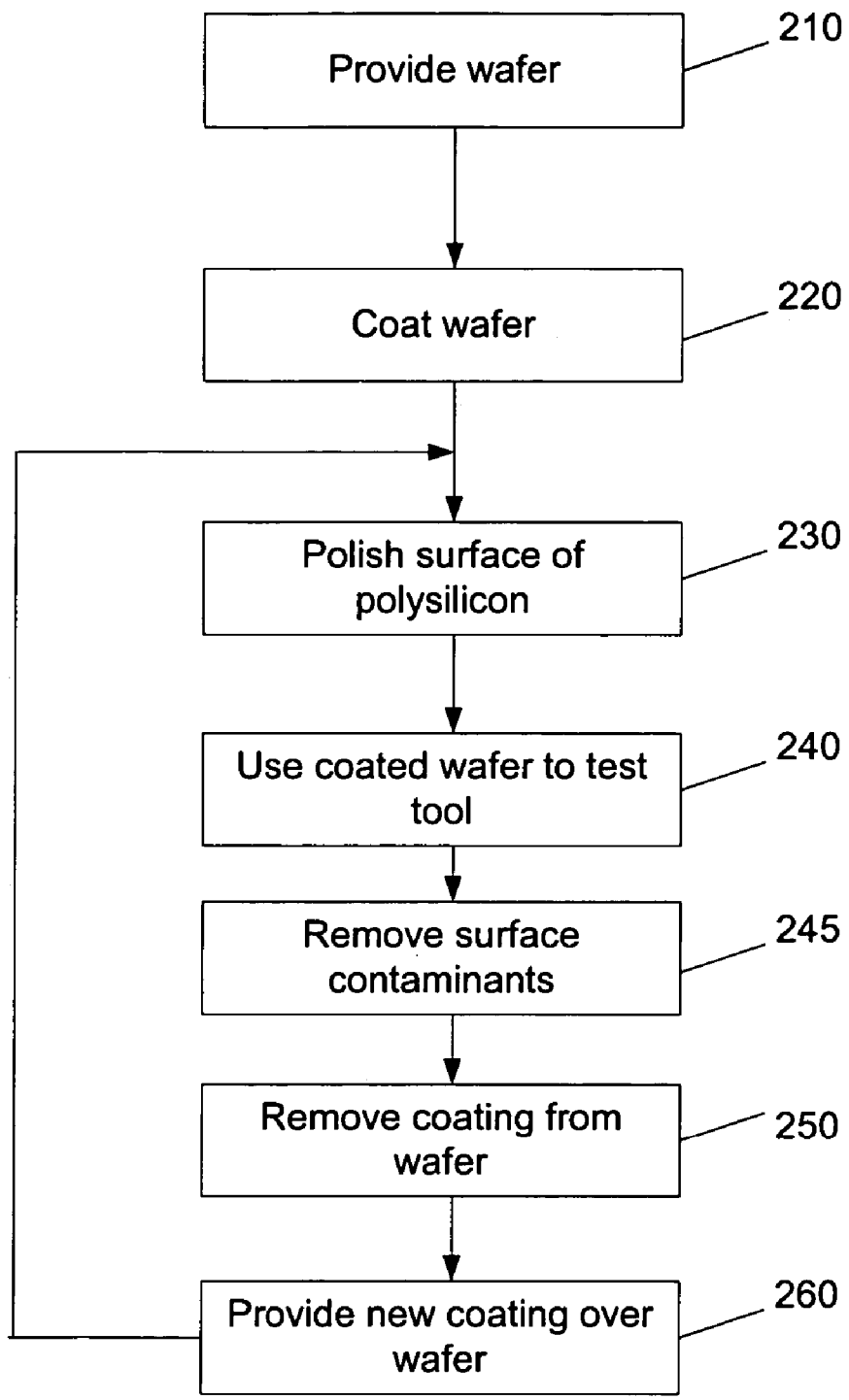
FIG. 2 depicts a flow diagram of a process in accordance with one embodiment of the present invention.
Figure 3:
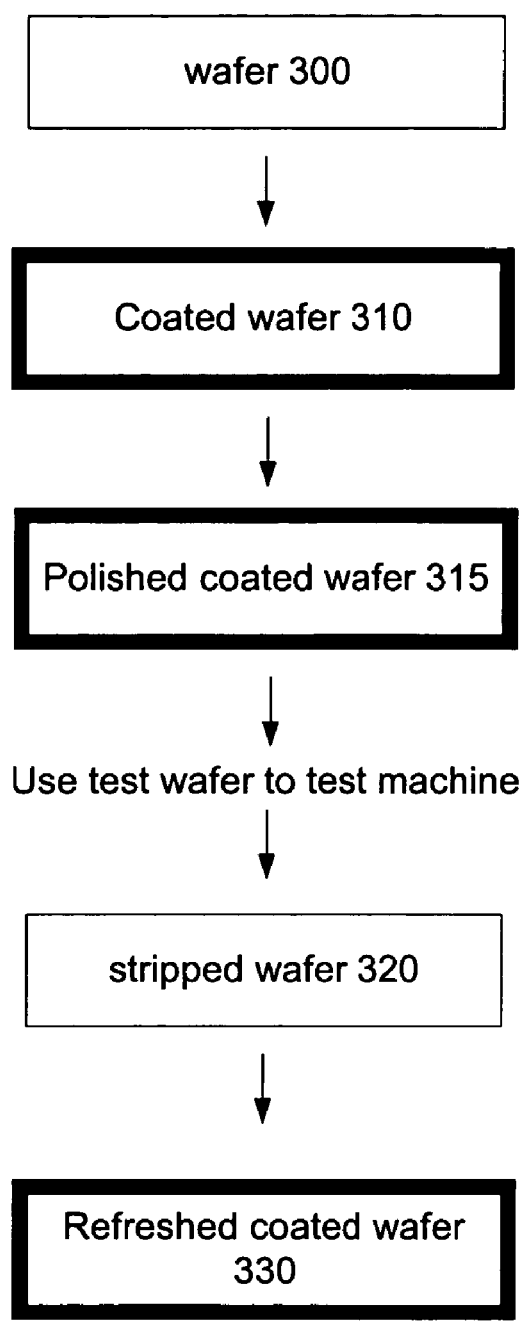
FIG. 3 depicts wafers that can be used in the process of FIG. 2.

FIG. 2 depicts a flow diagram of a process in accordance with one embodiment of the present invention that provides at least for multiple and potentially unlimited reuse of test wafers. FIG. 3 depicts wafers that can be used in the process of FIG. 2. In action 210, a silicon wafer (such as a single crystal silicon wafer or a low cost polycrystalline wafer) may be provided. The silicon wafer of action 210 may correspond to wafer 300 of FIG. 3. For example, low cost polycrystalline wafers can be made from cast ingots. For example, one suitable technique to fabricate low cost polycrystalline wafers is described in U.S. Pat. No. 6,406,981, although other techniques and/or wafers may be used.

In action 220, the silicon wafer may be coated with polysilicon. For example, action 220 may include using a chemical vapor deposition (CVD) process to coat at least the flat top and flat bottom surfaces of the wafer with polysilicon. A suitable thickness of the polysilicon may be approximately five (5) microns or less, although other thicknesses may be used. For example, to provide polysilicon, a suitable CVD process may include (1) using a vertical diffusion furnace to heat multiple stacked silicon wafers; (2) adding $SiCl_3$, $SiH_4$, or $SiHCl_3$; and (3) heating the stacked wafers to about 600° C. for approximately 2 to 4 hours. The polysilicon coated wafer of action 220 may correspond to coated wafer 310 of FIG. 3.

In action 230, the flat surfaces of the wafer coated with polysilicon may be polished. Action 230 may include utilizing chemical mechanical polishing (CMP). The surface polished polysilicon coated wafer of action 230 may correspond to polished coated wafer 315 of FIG. 3. For example, the polished surfaces may behave as a single crystal structure when analyzed using metrology tools. In one embodiment, the grain size of the polished surface of the polysilicon layer may be submicron size. In one embodiment, the polished surface of the polysilicon layer may create an insignificant distortion of the angle of refraction of incident light. The polished surface may also have very low density of light scattering defects as detected by a surface scan tool.

In one implementation, depositing and polishing the polysilicon layer results in very low contaminant (e.g., metal) levels at the wafer surface, similar to current single crystal based test wafers. Consequently, reused wafers may be used as virgin test wafer with no limitation as to semiconductor tools in which the wafer can be used, unlike the case for current test wafers.

In action 240, the surface polished coated wafer is used to test a semiconductor tool. For example, wafers with low light scattering properties can be used to test and qualify semiconductor wafer processing tools for their propensity to add particles to the wafer, where such added particles may scatter light. For example, to test film application by a semiconductor tool, film may be provided over the polished coated wafer and the thickness, uniformity of thickness of the film, and particles (light scattering defects) added by the process tool may be determined.

In action 245, surface contaminants (such as films and materials) formed on the polysilicon coating of the wafer after use in the semiconductor tool may be removed. For example, action 245 may include removing surface metals (such as copper, nitride, oxide, titanium nitride, or any film) provided over the surface of the test wafer after testing in action 240. For example, action 245 may include using chemical etching techniques such as SC1–SC2 clean.

In action 250, the coating may be removed from the test wafer used to test a semiconductor tool. For example, action 250 may include using mechanical grinding techniques to remove the polysilicon coating from the test wafer. The test wafer removed of films and materials formed on the polysilicon coating and its polysilicon coating may correspond to stripped wafer 320 of FIG. 3.

In action 260, a new coating may be provided over the wafer 320. For example, techniques similar to those described with respect to action 220 may be utilized. The wafer provided with the new coating may correspond to refreshed coated wafer 330 of FIG. 3. Action 230 may follow action 260. In the next execution of action 230, the wafer with the new polysilicon coating may be polished. In one implementation, wafer reuse primarily involves dry steps with the exception of chemical wafer cleaning. This substantially minimizes the potential for metal contamination on the surface of polished wafers.

Modifications

The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

What is claimed is:

1. A method comprising:
   providing a first coating over a wafer;
   testing a semiconductor tool using the coated wafer with the first coating; and
   replacing at least a portion of the first coating over the wafer with a layer of a second coating, wherein each of the first coating and the second coating comprises at least one characteristic of a single crystal structure.

2. The method of claim 1, further comprising testing surface contaminant adding properties of the semiconductor tool.

3. The method of claim 2, wherein the testing surface contaminant adding properties comprises testing light scattering properties of a surface of the first coating over the wafer.

4. The method of claim 1, wherein the at least one characteristic of the single crystal structure comprises insignificant distortion of an angle of refraction of incident light.

5. The method of claim 1, wherein the providing the first coating comprises:
   providing a polysilicon layer over the wafer; and
   surface polishing the polysilicon layer.

6. The method of claim 1, wherein the replacing comprises:
   mechanically grinding a portion of the first coating;
   providing a polysilicon layer over a portion of the wafer where the first coating was removed by grinding; and
   surface polishing the polysilicon layer.

7. The method of claim 1, further comprising removing contaminants from a surface of the first coating over the wafer used to test the semiconductor tool.

8. A method comprising:
   replacing at least a portion of a first coating of a wafer with a layer of a second coating, wherein each of the first coating and the second coating has at least one characteristic of a single crystal structure; and
   testing at least one characteristic of a semiconductor tool using the coated wafer with the second coating.

9. The method of claim 8, wherein the replacing comprises:
   mechanically grinding the first coating of the wafer;
   providing a polysilicon layer over a portion of the waFer where the first coating was removed by grinding; and
   surface polishing the polysilicon layer.

10. The method of claim 9, wherein the replacing further comprises removing contaminants from a surface of the first coating of the wafer.

11. The method of claim 8, further comprising testing surface contaminant adding properties of the semiconductor tool.

12. The method of claim 11, wherein the testing surface contaminant adding properties comprises testing light scattering properties of a surface of the second coating of the wafer.

13. The method of claim 8, wherein the at least one characteristic of the single crystal structure comprises insignificant distortion of an angle of refraction of incident light.

* * * * *